(12) United States Patent
Roa et al.

(10) Patent No.: US 8,558,365 B1
(45) Date of Patent: *Oct. 15, 2013

(54) PACKAGE IN PACKAGE DEVICE FOR RF TRANSCEIVER MODULE

(75) Inventors: Fernando Roa, Chandler, AZ (US); Roger D. St. Amand, Tempe, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/246,564

(22) Filed: Sep. 27, 2011

Related U.S. Application Data

(63) Continuation of application No. 12/351,690, filed on Jan. 9, 2009, now Pat. No. 8,058,715.

(51) Int. Cl.
*H01L 23/02* (2006.01)
(52) U.S. Cl.
USPC ............ 257/686; 257/777; 257/E23.085
(58) Field of Classification Search
USPC .................... 257/686, 777, E23.085
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,221,925 A | 9/1980 | Finley et al. | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |

(Continued)

FOREIGN PATENT DOCUMENTS

| DE | 19734794 A1 | 8/1997 |
|---|---|---|
| EP | 0393997 | 10/1990 |

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Phat X Cao

(57) ABSTRACT

In accordance with the present invention, there is provided multiple embodiments of a package-in-package semiconductor device including an RF package and a semiconductor die which are provided in a stacked arrangement and are each electrically connected to an underlying substrate through the use of conductive wires alone or in combination with conductive bumps. In certain embodiments of the present invention, the RF package and the semiconductor die are separated from each other by an intervening spacer which is fabricated from aluminum, or from silicon coated with aluminum. If included in the semiconductor device, the spacer is also electrically connected to the substrate, preferably through the use of conductive wires. The RF package, the semiconductor die, the spacer (if included) and a portion of the substrate are at least partially covered or encapsulated by a package body of the semiconductor device.

20 Claims, 2 Drawing Sheets

(56) References Cited

U.S. PATENT DOCUMENTS

| | | | |
|---|---|---|---|
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |
| 6,143,981 A | 11/2000 | Glenn |
| 6,150,709 A | 11/2000 | Shin et al. |
| 6,166,430 A | 12/2000 | Yamaguchi |
| 6,169,329 B1 | 1/2001 | Farnworth et al. |
| 6,177,718 B1 | 1/2001 | Kozono |

(56) References Cited

U.S. PATENT DOCUMENTS

| | | |
|---|---|---|
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,238,952 B1 | 5/2001 | Lin et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,281,568 B1 | 8/2001 | Glenn et al. |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,465,883 B2 | 10/2002 | Oloffson |
| 6,472,735 B2 | 10/2002 | Isaak |
| 6,475,646 B2 | 11/2002 | Park et al. |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori et al. |
| 6,495,909 B2 | 12/2002 | Jung et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Matthews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,818,973 B1 | 11/2004 | Foster |
| 6,858,919 B2 | 2/2005 | Seo et al. |
| 6,867,492 B2 | 3/2005 | Auburger et al. |
| 6,876,068 B1 | 4/2005 | Lee et al. |
| 6,878,571 B2 | 4/2005 | Isaak et al. |
| 6,897,552 B2 | 5/2005 | Nakao |
| 6,927,478 B2 | 8/2005 | Paek |
| 6,967,125 B2 | 11/2005 | Fee et al. |
| 6,995,459 B2 | 2/2006 | Lee et al. |
| 7,002,805 B2 | 2/2006 | Lee et al. |
| 7,005,327 B2 | 2/2006 | Kung et al. |
| 7,015,571 B2 | 3/2006 | Chang et al. |
| 7,045,396 B2 | 5/2006 | Crowley et al. |
| 7,053,469 B2 | 5/2006 | Koh et al. |
| 7,075,816 B2 | 7/2006 | Fee et al. |
| 7,102,209 B1 | 9/2006 | Bayan et al. |
| 7,109,572 B2 | 9/2006 | Fee et al. |
| 7,185,426 B1 | 3/2007 | Hiner et al. |
| 7,193,298 B2 | 3/2007 | Hong et al. |
| 7,211,471 B1 | 5/2007 | Foster |
| 7,242,081 B1 | 7/2007 | Lee |
| 7,245,007 B1 | 7/2007 | Foster |
| 7,253,503 B1 | 8/2007 | Fusaro et al. |
| 8,058,715 B1 * | 11/2011 | Roa et al. .................. 257/686 |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |

(56) References Cited

U.S. PATENT DOCUMENTS

| | | |
|---|---|---|
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1* | 4/2004 | Karnezos ............... 257/777 |
| 2004/0080025 A1 | 4/2004 | Kasahara et al. |
| 2004/0089926 A1 | 5/2004 | Hsu et al. |
| 2004/0164387 A1 | 8/2004 | Ikenaga et al. |
| 2004/0253803 A1 | 12/2004 | Tomono et al. |
| 2006/0087020 A1 | 4/2006 | Hirano et al. |
| 2006/0097402 A1* | 5/2006 | Pu et al. ............... 257/777 |
| 2006/0157843 A1 | 7/2006 | Hwang |
| 2006/0186524 A1* | 8/2006 | Aiba et al. ............... 257/686 |
| 2006/0216868 A1 | 9/2006 | Yang et al. |
| 2006/0231939 A1 | 10/2006 | Kawabata et al. |
| 2007/0023202 A1 | 2/2007 | Shibata |
| 2008/0230887 A1 | 9/2008 | Sun et al. |
| 2009/0001599 A1* | 1/2009 | Foong et al. ............... 257/777 |

FOREIGN PATENT DOCUMENTS

| | | |
|---|---|---|
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 652333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| JP | 2003243595 | 8/2003 |
| JP | 2004158753 | 6/2004 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

PACKAGE IN PACKAGE DEVICE FOR RF TRANSCEIVER MODULE

CROSS-REFERENCE TO RELATED APPLICATIONS

The present application is a continuation of U.S. application Ser. No. 12/351,690 entitled PACKAGE IN PACKAGE STRUCTURE FOR RF TRANSCEIVER MODULE filed Jan. 9, 2009 now U.S. Pat. No. 8,058,715.

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a package-in-package (PIP) semiconductor device which is configured to minimize the electrical interference between one internal semiconductor package and another internal semiconductor package or die from each other or from the surrounding environment, while minimizing the stack-up height of these internal electronic components. The configuration of the semiconductor device of the present invention also allows for ease in the testing thereof.

2. Description of the Related Art

Radio frequency (RF) shielding is required on certain semiconductor devices in order to minimize electro-magnetic interference (EMI) radiation from the semiconductor device. RF shielding is further sometimes required to prevent RF radiation from external sources from interfering with the operation of the semiconductor device.

RF shielding is generally accomplished in one of three ways. A first method is to attach a metal can over an electronic component such as a semiconductor package or a semiconductor die after such electronic component has been attached to an underlying support surface such as a printed circuit board. One alternative to the shield attach method is to embed an RF shield directly into a semiconductor package. In this embedded shield method, the RF shield (which is typically made of metal) is directly attached to the substrate of the semiconductor package through the use of solder or a conductive adhesive. The shield may be fully embedded within the mold compound of the finished semiconductor package, or can be exposed after assembly. Another method for facilitating RF shielding, often referred to as a conventional conformal shield, involves initially placing electronic components such as those described above on an underlying substrate or strip, and thereafter over-molding such substrate or strip in a manner defining individual mold caps thereon. These individual mold caps are oriented such that upwardly facing pads of the substrate or strip are exposed, i.e., not covered by the mold caps. A conductive coating is then applied to the substrate or strip such that it covers the units and also makes electrical contact to the upwardly facing pads. The substrate or strip is then singulated into individual units. Alternatively, the individual units may be singulated, thus exposing the metal layer(s) on the package edge, allowing the conformal coated shield to contact the exposed grounded metal.

In the electronics industry, there is also an increasing need for semiconductor devices of increased functional capacity, coupled with reduced size. This particular need is often being satisfied through the use of package-in-package (PIP) semiconductor devices. A typical PIP semiconductor device comprises various combinations of electronic components including passive devices, semiconductor dies, semiconductor packages, and/or other elements which are arranged in a horizontal direction, or stacked in a vertical direction on an underlying substrate. In many PIP devices, the substrate and the electronic components are interconnected to one another through the use of conductive wires alone or in combination with conductive bumps, with such electronic components thereafter being encapsulated by a suitable encapsulant material which hardens into a package body of the PIP device.

The present invention provides a unique combination of the above-described RF shielding and PIP technologies, and provides a PIP semiconductor device wherein an RF package and a die are stacked, with conformal shielding also being included to provide RF noise mitigation (i.e., minimize noise interference) between the RF package and the die (or any other component in the PIP device), or between the RF package and the external environment. These, as well as other features of the PIP device of the present invention, will be described in more detail below.

BRIEF SUMMARY OF THE INVENTION

In accordance with the present invention, there is provided multiple embodiments of a package-in-package semiconductor device wherein a conformally shielded RF package is stacked with a digital semiconductor die. The semiconductor device of the present invention provides adequate electrical isolation between the RF package and the semiconductor die, and further allows for the testing of the RF package prior to attachment. Thus, the semiconductor device makes use of vertical stacking with a conformally shielded RF package to integrate the functionality of the RF package into a single device, while still allowing for RF signal isolation.

The PIP semiconductor device constructed in accordance with each embodiment of the present invention essentially combines two technologies, namely, conformal shielding to isolate RF emitting devices from other devices and the ambient, and three-dimensional packaging which enables stacking different devices into a single package with space and cost savings. In the present invention, the RF package of the semiconductor device can be tested separately and prior to stacking as a way to provide for binning and selective application, with existing assembly capabilities thereafter being used to incorporate the RF package into any one of multiple vertical stacking configurations which will be described in more detail below. Thus, the present invention provides for great flexibility using off-the-shelf RF packages in new applications, providing adequate electrical isolation between the RF package and other electronic components integrated into the semiconductor device to minimize interference and allow for proper performance.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
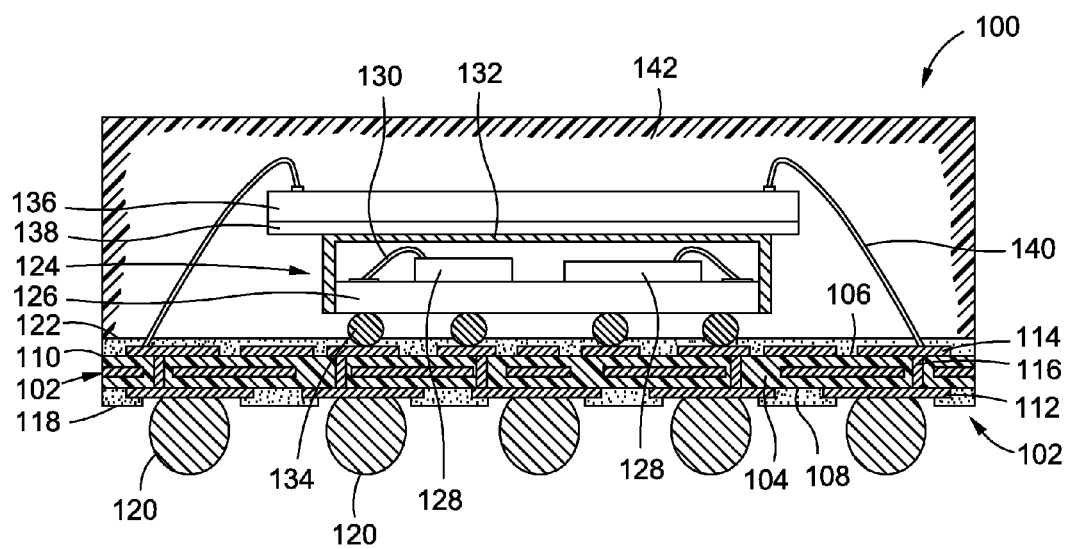
FIG. 1 is a cross-sectional view of a package-in-package semiconductor device constructed in accordance with a first embodiment of the present invention.

Referring now to the drawings wherein the showings are for purposes of illustrating various embodiments of the present invention only, and not for purposes of limiting the same, FIG. 1 illustrates a package-in-package semiconductor device 100 constructed in accordance with a first embodiment of the present invention. The semiconductor device 100 comprises a substrate 102 which functions to transmit electrical signals to and from the semiconductor device 100. The substrate 102 comprises an insulative layer 104 which defines a generally planar first (top) surface 106 and an opposed, generally planar second (bottom) surface 108. The insulative layer 104 further comprises a third (side) surface 110 which extends generally perpendicularly between the top and bottom surfaces 106 and 108. The insulative layer 104 may comprise a base film formed from a thermosetting resin, a polyimide, or an equivalent material.

The substrate 102 further comprises one or more electrically conductive lands 112 which are formed on the bottom surface 108 in a prescribed pattern or arrangement. The substrate 102 also includes an electrically conductive pattern 114 which is formed on the top surface 106. The conductive pattern 114 may comprise various pads, lands, traces, or combinations thereof. In the substrate 102, the lands 112 and the conductive pattern 114 are electrically connected to each other in a prescribed pattern or arrangement through the use of conductive vias 116 which extend through the insulative layer 104 between the top and bottom surfaces 106, 108 thereof in the manner shown in FIG. 1. In the semiconductor device 100, it is contemplated that the lands 112, conductive pattern 114 and vias 116 will each be formed from copper or a suitable equivalent material having acceptable electrical conductivity. With particular regard to the vias 116, it is further contemplated that such vias 116 may be formed by coating the walls of cylindrical apertures extending through the insulative layer 104 with a conductive metal film which places the lands 112 into electrical connection with the conductive pattern 114 in a prescribed manner.

The substrate 102 further preferably includes a solder mask 118 which is formed on the bottom surface 108 of the insulative layer 104. As seen in FIG. 1, the solder mask 118 is formed to surround and cover a predetermined region of the periphery of each of the lands 112. As also seen in FIG. 1, it is contemplated that in the semiconductor device 100, solder balls 120 will be electrically coupled to respective ones of the lands 112, such solder balls 120 being used to transmit electrical signals between the semiconductor device 100 and an external device. The solder mask 118, which contacts each of the solder balls 120, electrically insulates each of the solder balls 120 from the adjacent lands 112 on which other solder balls 120 are formed. In the substrate 102, portions of the conductive pattern 114 of the substrate 102 may also be covered by a solder mask 122 which is included on the top surface 106 of the substrate 102 as shown in FIG. 1.

The semiconductor device 100 further comprises a semiconductor package, and more particularly an RF package 124, which is mounted and electrically connected to the substrate 102 in a manner which will be described in more detail below. The RF package 124 comprises a package substrate 126 which includes an insulating layer defining opposed top and bottom surfaces and electrically conductive patterns formed on respective ones of the opposed top and bottom surfaces of the insulating layer. In the package substrate 126, the conductive patterns disposed on respective ones of the opposed top and bottom surfaces of the insulating layer are electrically connected to each other in a prescribed pattern or arrangement through the use of vias which extend through the insulating layer. The package substrate 126 of the RF package 124 can itself be selected from rigid circuit boards, flexible circuit boards and equivalents thereto, with the structure of the package substrate 126 potentially being the same as that of the substrate 102 described above.

Attached to the insulating layer of the package substrate 126 are one or more electronic components 128. As shown in FIG. 1, two electronic components 128 are attached to the top surface of the insulating layer of the package substrate 126. However, those of ordinary skill in the art will recognize that fewer or greater than two electronic components 128 may be included in the RF package 124 without departing from the spirit and scope of the present invention. The electronic components 128 included in the RF package 124 may include, for example, a balun and an RF transceiver. In the RF package 124, the electronic components 128 are electrically connected to the conductive patterns of the package substrate 126 through the use of inner conductive wires 130 in the manner shown in FIG. 1.

In addition to the above-described components, the RF package 124 includes an RF shield 132 which is applied to the package substrate 126 and, in some cases, to the outer surface of the package body 142 described below. The RF shield 132 may be applied by plating, vacuum printing, vacuum deposition, insert molding, spray coating, and the like. More particularly, as also shown in FIG. 1, the RF shield 132 is applied to the peripheral side surfaces of the insulating layer of the package substrate 126 such that the RF shield 132 effectively covers or shields the electronic components 128 and the inner conductive wires 130 used to electrically connect the electronic components 128 to the conductive patterns of the package substrate 126. Those of ordinary skill in the art will recognize that the above-described configuration of the RF package 124 is exemplary only, and that the present invention contemplates that any one of a multiplicity of currently known RF package configurations may be integrated into the semiconductor device 100.

In the semiconductor device 100, the RF package 124 is electrically connected to the conductive pattern 114 of the substrate 102 through the use of a plurality of conductive bumps 134. More particularly, as seen in FIG. 1, the conductive bumps 134 extend between the conductive pattern 114 and prescribed portions of the conductive pattern disposed on that surface of the insulating layer of the package substrate 126 opposite that having the electronic components 128 mounted thereto. Examples of suitable materials for the conductive bumps 134 include, but are not limited to, gold, silver, soldering materials, or equivalents thereto. In the semiconductor device 100, the solder mask 122 disposed on the top surface of the insulating layer 104 of the substrate 102 preferably extends into contact with each of the conductive bumps 134.

The semiconductor device 100 of the present invention further comprises a semiconductor die 136 which it attached to the RF package 124 and electrically connected to the substrate 102. More particularly, as seen in FIG. 1, the semiconductor die 136 defines opposed, generally planar top and bottom surfaces, with the bottom surface being attached to the top surface (when viewed from the perspective shown in FIG. 1) of the RF shield 132 of the RF package 124 through the use of an adhesive layer 138. The semiconductor die 136, which preferably comprises a baseband die, includes a plurality of contacts or terminals disposed on the top surface thereof, such terminals being electrically connected to the conductive pattern 114 of the substrate 102 through the use of respective ones of a plurality of conductive wires 140. As shown in FIG. 1, the width of the semiconductor die 136 exceeds that of the RF package 124, such that a peripheral portion of the semiconductor die 136 protrudes beyond or overhangs the peripheral side surface of the RF shield 132 of the RF package 124. However, those of ordinary skill in the art will recognize that the semiconductor die 136 may alternatively be sized such that the peripheral side surface thereof is substantially flush with or disposed inwardly relative to the peripheral side surface of the RF shield 132 of the RF package 124 without departing from the spirit and scope of the present invention.

In the semiconductor device 100, the RF package 124, the semiconductor die 136, the conductive bumps 134 and a portion of the substrate 102 (including portions of the solder mask 122 and any exposed portions of the top surface of the insulating layer 104 and conductive pattern 114) are each encapsulated or covered by an encapsulant material which ultimately hardens into a package body 142 of the semiconductor device 100. The present invention is not intended to be limited to any specific material which could be used to facilitate the fabrication of the package body 142. For example, and not by way of limitation, the package body 142 can be formed from epoxy molding compounds or equivalents thereto. The fully formed package body 142 preferably includes side surfaces which extend in generally flush or co-planar relation to respective side surfaces of the insulating layer 104 of the substrate 102.

Figure 2:
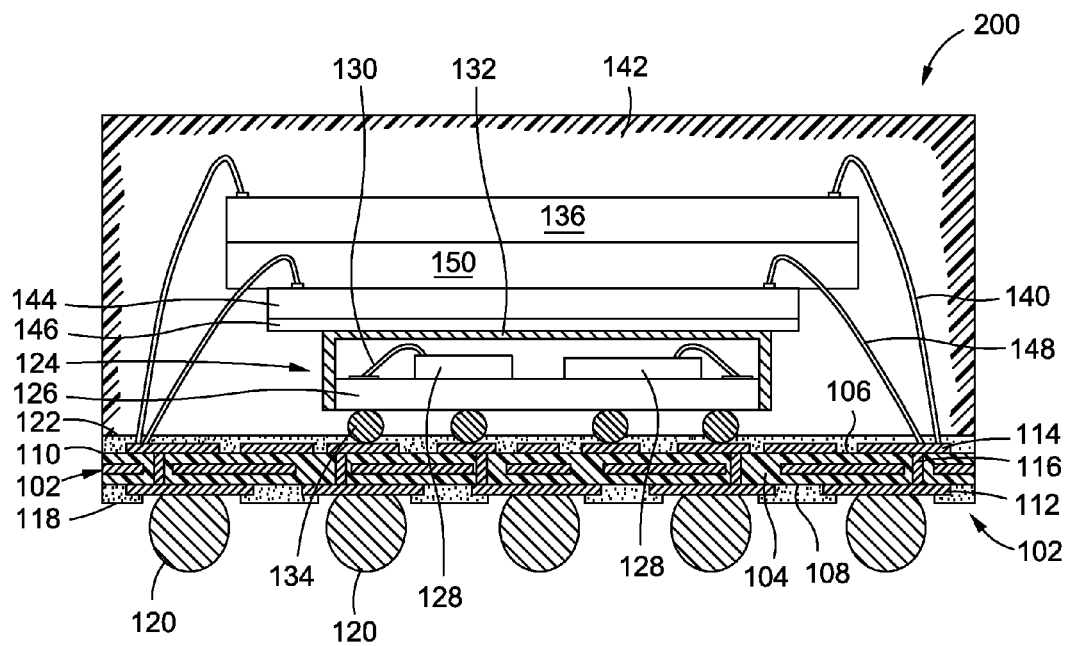
FIG. 2 is a cross-sectional view of a package-in-package semiconductor device constructed in accordance with a second embodiment of the present invention.

Referring now to FIG. 2, there is shown a semiconductor device 200 constructed in accordance with a second embodiment of the present invention. The semiconductor device 200 is similar to the above-described semiconductor device 100, with only the differences between the semiconductor devices 200, 100 being described below.

In the semiconductor device 200, an aluminized spacer 144 is interposed between the RF package 124 and the semiconductor die 136. More particularly, as seen in FIG. 2, the spacer 144 has a generally quadrangular configuration defining opposed, generally planar top and bottom surfaces. The bottom surface of the spacer 144 is attached to the top surface of the RF package 124, i.e., the top surface of the RF shield 132 when viewed from the perspective shown in FIG. 2. The attachment of the bottom surface of the spacer 144 to the top surface of the RF shield 132 of the RF package 124 is preferably accomplished through the use of an adhesive layer 146. The spacer 144 is typically fabricated from a silicon core which is at least partially coated or plated with an aluminum layer. Alternatively, the spacer 144 may be formed entirely from aluminum. As shown in FIG. 2, the width of the spacer 144 exceeds that of the underlying RF package 124, such that a peripheral portion of the spacer 144 protrudes beyond or overhangs the peripheral side surface of the RF shield 132 of the RF package 124. However, those of ordinary skill in the art will recognize that the spacer 144 may alternatively be sized such that the peripheral side surface thereof is substantially flush with the peripheral side surface of the RF shield 132 of the RF package 124 without departing from the spirit and scope of the present invention.

In the semiconductor device 200, the spacer 144 is preferably placed into electrical communication with the substrate 102 through the use of one or more conductive wires 148. More particularly, as seen in FIG. 2, one end of each conductive wire 148 is preferably attached to a prescribed location on the top surface of the spacer 144 through the use of, for example, a ball-bonding or a stitch-bonding technique. The remaining, opposite end of the same conductive wire 148 is electrically connected to a prescribed portion of the conductive pattern 114 of the substrate 102.

In the semiconductor device 200 as shown in FIG. 2, the width of the semiconductor die 136 exceeds that of the underlying spacer 144. As a result, to accommodate the loop height of the conductive wires 148, the semiconductor device 200 further comprises a film-over-wire (FOW) 150 which is disposed on and completely covers the top surface of the spacer 144. In addition, the FOW 150 covers or encapsulates portions of the conductive wires 148, and in particular those portions of the conductive wires 148 which extend and are electrically connected to the top surface of the spacer 144. The FOW 150 is preferably a die attach material which remains in a semi-cured state (B-stage) before curing. Accordingly, when the FOW 150 is initially applied to the spacer 144, the conductive wire(s) 148 are naturally situated within the FOW 150. As shown in FIG. 2, due the width of the semiconductor die 136 exceeding that of the underlying spacer 144 and the need for the FOW 150 to accommodate the semiconductor die 136, the width of the FOW 150 also exceeds that of the underlying spacer 144, such that a peripheral portion of the FOW 150 protrudes beyond or overhangs the peripheral side surface of the spacer 144. However, those of ordinary skill in the art will recognize that the FOW 150 may alternatively be sized such that the peripheral side surface thereof is substantially flush or co-planar with the peripheral side surface of the spacer 144 without departing from the spirit and scope of the present invention.

In the semiconductor device 200, the widths of the semiconductor die 136 and the FOW 150 are preferably substantially equal to each other, with the bottom surface of the semiconductor die 136 being directly engaged to the top surface of the FOW 150 when viewed from the perspective shown in FIG. 2. In this regard, the peripheral side surface of the semiconductor die 136 extends in substantially flush or co-planar relation to the peripheral side surface of the FOW 150 as shown in FIG. 2. However, those or ordinary skill in the art will recognize that the semiconductor die 136 may alternatively be sized such that the peripheral side surface thereof of disposed outwardly (i.e., overhangs) or inwardly relative to the peripheral side surface of the FOW 150 without departing from the spirit and scope of the present invention. Further, it is contemplated that if the semiconductor die 136 is of a width which is less than that of the spacer 144, the FOW 150 may be eliminated in its entirety, provided that the peripheral side surfaces of the semiconductor die 136 could be disposed inboard of those locations on the top surface of the spacer 144 to which the conductive wires 148 are electrically connected. In this instance, the bottom surface of the semiconductor die 136 could be attached to a central portion of the top surface of the spacer 144 through the use of a suitable adhesive. Also, if the FOW 150 is sized and oriented relative to the spacer 144 such that the peripheral side surfaces of the FOW 150 and spacer 144 are substantially flush or co-planar with each other, the semiconductor die 136 may also be sized such that the peripheral side surface thereof extends in substantially flush, co-planar relation to the co-planar peripheral side surfaces of the FOW 150 and spacer 144.

In the semiconductor device 200, the package body 142 covers the FOW 150 and spacer 144, in addition to those components described above in relation to the semiconductor device 100. The spacer 144 included in the semiconductor device 200 supplements the effect of the RF shield 132 of the RF package 124 in minimizing noise interference between the RF package 124 and semiconductor die 136, and further assists in preventing exposure of the RF package 124 to noise interference from the ambient environment.

Figure 3:
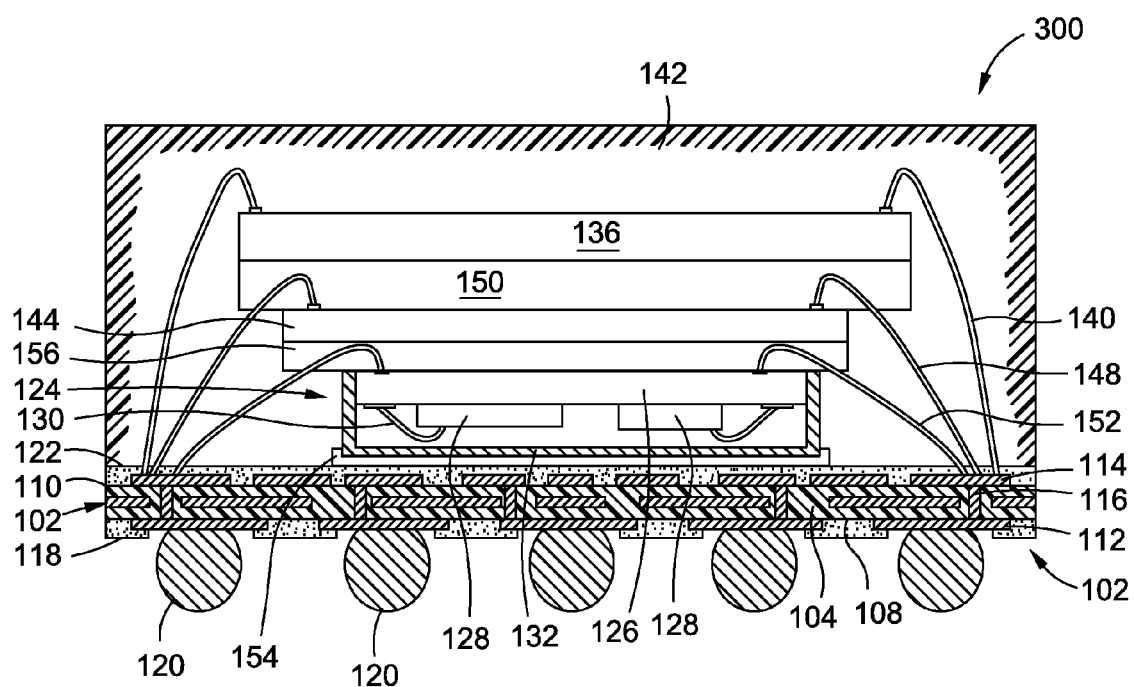
FIG. 3 is a cross-sectional view of a package-in-package semiconductor device constructed in accordance with a third embodiment of the present invention.

Referring now to FIG. 3, there is shown a semiconductor device 300 constructed in accordance with a third embodiment of the present invention. The semiconductor device 300 is similar to the above-described semiconductor device 200, with only the differences between the semiconductor devices 300, 200 being described below.

In the semiconductor device 300, the conductive bumps 134 included in the semiconductor devices 100, 200 and used to electrically connect the RF package 124 to the substrate 102 are eliminated. In this regard, the electrical connection of the RF package 124 of the semiconductor device 300 to the substrate 102 thereof is facilitated by conductive wires 152. More particularly, as seen in FIG. 3, one end of each of the conductive wires 152 is electrically connected to a portion of the conductive pattern disposed on that surface of the insulating layer of the package substrate 126 of the RF package 124 opposite that having the electronic components 128 mounted thereto. The remaining end of the same conductive wire 152 is electrically connected to a prescribed portion of the conductive pattern 114 of the substrate 102. As is apparent from FIG. 3, to allow for the use of conductive wires 152 to facilitate the electrical connection thereof to the substrate 102, the RF package 124 of the semiconductor device 300, as viewed from the perspective shown in FIG. 3, is flipped over relative to its orientation as viewed from the perspective shown in FIGS. 1 and 2 in relation to respective ones of the semiconductor devices 100, 200. In this regard, in the semiconductor device 300, the RF shield 132 of the RF package 124 is attached directly to a central portion of the top surface of the insulating layer 104 of the substrate 102 through the use of an adhesive layer 154.

In the semiconductor device 300, the above-described spacer 144 is interposed between the RF package 124 and the semiconductor die 136 in the manner shown in FIG. 3. However, due to the width of the spacer 144 exceeding the width of the RF package 124, to accommodate the loop height of the conductive wires 152 used to electrically connect the RF package 124 to the substrate 102, the attachment of the spacer 144 to the package substrate 126 of the RF package 124 is facilitated by a film-over-wire (FOW) 156 as an alternative to the adhesive layer 146 described above in relation to the semiconductor device 200. As seen in FIG. 3, the FOW 156 completely covers that surface of the package substrate 126 of the RF package 124 disposed furthest from the substrate 102. In addition, the FOW 156 covers or encapsulates portions of the conductive wires 152. The FOW 156 is preferably fabricated from the same material described above in relation to the FOW 150.

As shown in FIG. 3, due to the width of the spacer 144 exceeding that of the underlying RF package 124 and the need for the FOW 156 to accommodate the spacer 144, the width of the FOW 156 exceeds the width of the underlying RF package 124, with a peripheral portion of the FOW 156 protruding beyond or overhanging the peripheral side surface of the RF shield 132 of the RF package 124. However, those of ordinary skill in the art will recognize that the FOW 156 may alternatively be sized such that the peripheral side surface thereof is substantially flush or co-planar with the peripheral side surface of the RF shield 132 of the RF package 124 without departing from the spirit and scope of the present invention. The relative sizes of the spacer 144, FOW 150 and semiconductor die 136 included in the semiconductor device 300 may be varied from that shown in FIG. 3 in the same manner described above in relation to the semiconductor device 200. Along these lines, it is further contemplated that the peripheral side surfaces of the RF shield 132, FOW 156, spacer 144, FOW 150 and semiconductor die 136 in the semiconductor device 300 may all extend in generally co-planar relation to each other.

In the semiconductor device 300, the package body 142 covers the FOW 156, in addition to those components described above in relation to the semiconductor devices 100, 200. The spacer 144 included in the semiconductor device 300 also supplements the effect of the RF shield 132 of the RF package 124 in minimizing noise interference between the RF package 124 and semiconductor die 136, and further assists in preventing exposure of the RF package 124 to noise interference from the ambient environment.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device, comprising:
   a substrate having a conductive pattern disposed thereon;
   an RF package including a package substrate having an RF shield attached thereto, wherein the package substrate is electrically connected to the conductive pattern of the substrate;
   a conductive spacer attached to the RF shield and electrically connected to the conductive pattern of the substrate;
   a semiconductor die stacked upon the conductive spacer and electrically connected to the conductive pattern of the substrate; and
   a package body at least partially encapsulating the RF package, the conductive spacer, the semiconductor die and the substrate.

2. the semiconductor device of claim 1 wherein the substrate comprises:
   an insulative layer defining opposed first and second surfaces; and
   a plurality of lands disposed on the second surface;
   the conductive pattern being disposed on the first surface and electrically connected to the lands in a prescribed manner.

3. The semiconductor device of claim 1 wherein the RF package is electrically connected to the conductive pattern by conductive bumps which are encapsulated by the package body.

4. The semiconductor device of claim 1 wherein the semiconductor die is electrically connected to the conductive pattern by at least one conductive wire which is encapsulated by the package body.

5. The semiconductor device of claim 1, wherein the conductive spacer is electrically connected to the substrate by at least one conductive wire, and wherein the semiconductor die is attached to the conductive spacer by a film-over-wire that encapsulates a portion of the at least one conductive wire, and wherein the package body encapsulates a remaining portion of the at least one conductive wire.

6. The semiconductor device of claim 5, wherein:
the RF shield of the RF package defines a peripheral side surface; and
the semiconductor die defines a peripheral side surface, at least a portion of which protrudes outwardly beyond the side surface of the RF shield.

7. A semiconductor device, comprising:
a substrate;
an RF package including a package substrate which is electrically connected to the substrate by conductive bumps, a plurality electronic components attached to a top surface of the package substrate, inner wire bonds electrically connecting the plurality of electronic components to the package substrate, and an RF shield which is attached to the package substrate without extending to the substrate, wherein the RF shield is spaced apart from the inner wire bonds and the plurality of electronic components;
a semiconductor die stacked upon the RF package; and
a package body at least partially encapsulating the RF package, the semiconductor die, the conductive bumps, and the substrate.

8. The semiconductor device of claim 7 wherein the substrate comprises:
an insulative layer defining opposed first and second surfaces;
a plurality of lands disposed on the second surface; and
a conductive pattern disposed on the first surface and electrically connected to the lands in a prescribed manner;
the conductive bumps being used to facilitate the electrical connection of the RF package to the conductive pattern.

9. The semiconductor device of claim 7 wherein the semiconductor die is electrically connected to the substrate by at least one conductive wire which is encapsulated by the package body.

10. The semiconductor device of claim 7 further comprising a spacer interposed between the semiconductor die and the RF shield, wherein the spacer is electrically connected to the substrate by at least one conductive wire, and wherein the semiconductor die attached to the spacer by a film-over-wire that encapsulates a portion of the at least one conductive wire, and wherein the package body encapsulates a remaining portion of the at least one conductive wire.

11. The semiconductor device of claim 7 wherein:
the RF shield of the RF package defines a peripheral side surface; and
the semiconductor die defines a peripheral side surface, at least a portion of which protrudes outwardly beyond the side surface of the RF shield.

12. A semiconductor device, comprising:
a substrate;
a RF package electrically connected to the substrate, the RF package including a package substrate having an RF shield attached thereto;
a spacer attached to the RF shield and electrically coupled to the substrate by at least one conductive wire;
a semiconductor die attached to the spacer and electrically connected to the substrate, wherein the semiconductor die is attached to the spacer by a film-over-wire that encapsulates a portion of the at least one conductive wire; and
a package body at least partially encapsulating the RF package, the semiconductor die, the spacer, a remaining portion of the at least one conductive wire, and the substrate.

13. The semiconductor device of claim 12 wherein the substrate comprises:
an insulative layer defining opposed first and second surfaces;
a plurality of lands disposed on the second surface; and
a conductive pattern disposed on the first surface and electrically connected to the lands in a prescribe manner.

14. The semiconductor device of claim 13 wherein the RF package is electrically connected to the conductive pattern by conductive bumps which are encapsulated by the package body.

15. The semiconductor of claim 13 wherein the semiconductor die is electrically connected to the conductive pattern by at least one conductive wire which is encapsulated by the package body.

16. The semiconductor device of claim 12 wherein the semiconductor die and the film-over-wire have substantially equal widths.

17. The semiconductor device of claim 12 wherein:
the RF shield of the RF package defines a peripheral side surface; and
the semiconductor die defines a peripheral side surface, at least a portion of which protrudes outwardly beyond the side surface of the RF shield.

18. The semiconductor device of claim 12, wherein the spacer protrudes outwardly beyond a peripheral side surface of the RF shield.

19. The semiconductor device of claim 12, wherein the RF package comprises a plurality of electrical components electrically connected to the package substrate.

20. The semiconductor device of claim 12 wherein:
the spacer is attached to the RF shield by an adhesive layer; and
the semiconductor die is attached to the spacer have different widths.

* * * * *